United States Patent [19]

Toggweiler

[11] Patent Number: 5,660,643
[45] Date of Patent: Aug. 26, 1997

[54] SOLAR CELL SYSTEM

[75] Inventor: Peter Toggweiler, Schweiz, Switzerland

[73] Assignee: Hlusuisse Technology & Management Ltd., Neuhausen am Rheinfall, Switzerland

[21] Appl. No.: 628,769

[22] PCT Filed: Sep. 24, 1996

Related U.S. Application Data

[63] Continuation of Ser. No. 392,837, filed as PCT/CH94/00107 Jun. 6, 1994 published as WO95/01654 Jan. 12, 1995, abandoned.

[30] Foreign Application Priority Data

Jun. 29, 1993 [CH] Switzerland .................. 01 958/93

[51] Int. Cl.⁶ .................................................. H01L 31/05
[52] U.S. Cl. ........................................ 136/244; 136/256
[58] Field of Search .................................. 136/244, 256, 136/293; 323/906

[56] References Cited

U.S. PATENT DOCUMENTS

| | | | |
|---|---|---|---|
| 4,217,633 | 8/1980 | Evans, Jr. ............................ | 363/27 |
| 4,789,641 | 12/1988 | Inuzuka ................................ | 437/4 |
| 4,980,574 | 12/1990 | Cirrito ................................. | 307/21 |
| 5,268,037 | 12/1993 | Glatfelter ........................... | 136/249 |
| 5,296,043 | 3/1994 | Kawakami et al. ................. | 136/244 |
| 5,421,908 | 6/1995 | Yoshida et al. ..................... | 136/244 |

FOREIGN PATENT DOCUMENTS

| | | | |
|---|---|---|---|
| 0111394 | 6/1984 | European Pat. Off. ............ | 136/251 |
| 0427934 | 5/1991 | European Pat. Off. ............ | 136/244 |
| 4017860 | 12/1991 | Germany . | |
| 4101594 | 7/1992 | Germany . | |
| 60-149178 | 8/1985 | Japan ................................ | 136/244 |
| 3-239375 | 10/1991 | Japan ................................ | 136/244 |

*Primary Examiner*—Aaron Weisstuch
*Attorney, Agent, or Firm*—Anderson Kill & Olick PC

[57] ABSTRACT

A solar cell system including at least one large-area, amorphous, thin-layer solar cell, at least one electrical voltage converter for increasing the level of the electrical voltage of the electrical current, which is produced by the solar cell, to a level required by a load, and a plurality of current collectors connecting the solar cell with the voltage converter.

17 Claims, 2 Drawing Sheets

SOLAR CELL SYSTEM

This is a continuation of application Ser. No. 08/392,837, filed as PCT/CH94/00107 published as WO95/01654 Jan. 12, 1995, now abandoned.

BACKGROUND OF THE INVENTION

Solar cell installations are a model of environmental compatibility: in service they generate neither emissions, waste heat nor noise. The technical potential of solar cell installations for the generation of power is very considerable throughout the world. They can be applied practically anywhere and for any purpose, such as the decentralized supply of energy to remote settlements, centralized power generation in solar-powered vehicles.

The extent to which the potential of solar cells can be realized is largely dependent on whether the development of solar cells leads to cheaper manufacturing processes—if this proves to be the case, it is conceivable that a significant proportion of power generation may be met with solar cells, even in the industrialized nations with their low amounts of sunshine.

Ways and means of lowering the manufacturing costs of solar cells have accordingly been sought.

Solar cells are based on the so-called photo-voltaic effect. Sunlight is capable of liberating charge carriers which can be separated at the interface between two different semiconductors, so that an electrical voltage is produced. Its detailed mechanism is as follows.

Where an electron conducting or n-type semiconductor (e.g. silicon doped with trace amount of phosphorus) is situated adjacent to a hole conducting or p-type semiconductor (e.g. silicon doped with trace amounts of boron), an internal electrical field is produced in the boundary zone, i.e. the p-n transition. Negatively charged electrons migrate from the n-semiconductor to the p-semiconductor, and holes (positively charged sites not occupied by electrons) from the p-semiconductor to the n-semiconductor, in order to compensate for the charge gradient at the interface. If light, e.g. solar radiation, is now absorbed by the semiconductor, it causes pairs of electrons and holes to be released on both sides of the interface. Under the influence of the internal field, the electrons collect in the n-type semiconductor, and the holes in the p-type semiconductor, causing a photoelectric voltage equal and opposite to the internal field to occur between the two sides. Contacts can be used to tap this photoelectric voltage and supply it to an external circuit. The current intensity increases with the intensity of illumination and the size of the illuminated area. The voltage is dependent on the semiconductor materials. Commercial crystalline silicon solar cells measure up to 10 cm×10 cm and produce a voltage of approximately 0.5 volt and a peak power output of 1 watt. Higher voltages and power outputs are required, however, in solar cell installations. According to the prior art, manufacturers connect several solar cells one after the other in series and encapsulate them under glass in a weatherproof fashion to produce a solar module, in the form of a replaceable unit. A solar cell generator can be made by connecting together one or more modules in series or in parallel to provide the desired voltage or power output. According to the crystalline form of the semiconductor, it is possible to distinguish between three basic types of solar cells, with silicon being the predominant semiconductor material.

There are what are known as monocrystalline solar cells. Their manufacture involves drawing a p-type silicon monocrystal ingot from a molten silicon mass and slicing it into wafers of about 0.4 mm in thickness. The front face directed towards the solar radiation is doped by the diffusion of, for example, an n-type dopant, e.g. phosphorus, with a thickness of three to four microns to produce the p-n transition that is critical for the principle to function. Metal contacts for collecting the current are vacuum-metallized on both faces. In the case of the front face, this is in the form of a lattice covering not more than 10 per cent of the surface area so as to permit the transmission of the greatest possible amount of solar radiation. The largest crystals or wafers have a diameter of approx. 15 cm.

The individual solar cells are connected together in series to form a module by connecting the positive metal contact of each solar cell to the negative metal contact of a neighboring solar cell, or vice versa, by means of contact connectors. This series connection results in spatial gaps between the solar cells of a module, known as inactive zones, where the solar energy is unutilized.

Also know are polycrystalline solar cells, the manufacture of which involves casting a block of silicon consisting of a large number of small crystals, which block is then sliced and processed in the same way as the monocrystal. Its efficiency is lower than that of monocrystalline solar cells.

Finally, thin-layer cells are also known. In this case a one micron thick p-i-n sandwich (p-type conductor, undoped intrinsic semiconductor, and n-type conductor), is applied to a glass, film, or metal strip by a variety of processes, e.g. vacuum-metallization or vapor deposition. This p-i-n sandwich is neither a monocrystal or polycrystal, but remains amorphous (without structure). The presence of the i-type conductor is necessary, as excessive recombination would otherwise take place in the amorphous p-type and n-type conductors, leading to reduced efficiency. The collection of the current takes place on the front face via a transparent, conductive layer of tin oxide, and on the rear face via an aluminum contact layer.

Cells of this kind basically can be made to any desired size. The layers are applied without discontinuities. However, in order to obtain the required voltage, the layers are subsequently perforated by an expensive process involving the use of laser cutters. Both the front and the rear contact layers are perforated at regular intervals by straight grooves, and are divided up in this way into a large number of cells. The grooves in the upper contact layer are slightly offset in relation to the grooves in the lower contact layer, so that the peripheral zone of the front contact layer of a cell and the peripheral zone of the rear contact layer of the adjacent cell overlap. The two overlapping zones are connected to one another by means of a link of silver or some other conductive material, which runs perpendicular to the contact layers and parallel to the two adjacent grooves. In this way, neighboring cells are also connected in series.

The resulting modules suffer from the disadvantage that they are unable to utilize solar energy, i.e. they are inactive, in the zones of the silver links. Their manufacture is also very time-consuming and is associated with correspondingly high costs. The laser cutting machines required for perforating the layers are also very expensive. The laser cutting process also creates a lot of unnecessary and environmentally undesirable waste. The reinstatement of the links between the cells is also a costly and expensive process.

OBJECT AND SUMMARY OF THE INVENTION

The object of the present invention is a solar cell system with one or more amorphous thin-layer cells, the manufacture of which is possible without cutting the semiconductor layer, and the modules of which exhibit no, or at least fewer, inactive zones.

The object of the invention is achieved in accordance with the invention with the help of the design characteristics as set forth below.

In the solar cell system that is the object of the present invention, the voltage level of the D.C. electrical current produced by a solar cell generator required by a load device is achieved in that the thin-layer solar cells are connected with electronic voltage converters and not, as previously, by the connection in series of a large number of individual solar cells. In this solar cell system, an individual thin-layer solar cell is either restricted with regard to its surface area, or is unrestricted if the thin-layer cell is produced by a continuous production process (e.g. manufacture in strip form). Such processes allow the production of thin-layer cells with more or less unlimited surface area.

The large-area thin-layer solar cells of the proposed solar cell system are at least as large as an earlier complete solar module.

They are equipped, furthermore, with special current collector systems, which are capable of leading off the high currents.

Pairs of such solar dells can either be connected in parallel or inserted in a mid-point tapping.

DETAILED DESCRIPTION OF TEE PREFERRED EMBODIMENTS

Figure 2:
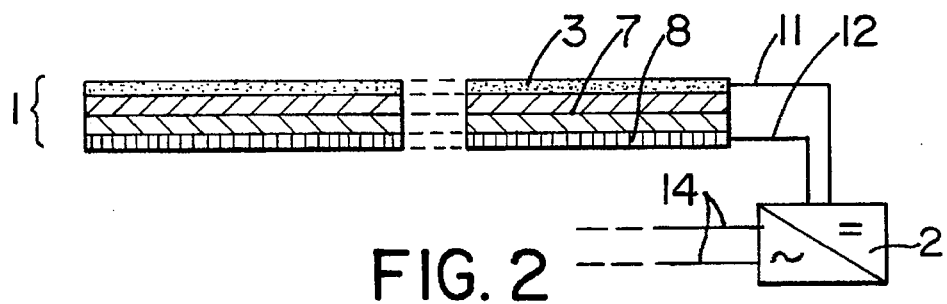
FIG. 2 is a schematic construction of a thin-layer solar cell combined with an electronic voltage converter.

The most important elements of the proposed solar cell system are large-area, amorphous, thin-layer solar cells 1 and electronic voltage converters 2 (see FIG. 2). These voltage converters 2 serve the purpose of increasing the electrical voltage of the D.C. electrical current produced by the thin-layer solar cells 1 from about 0.5 volt to 10 or more volts. The load normally requires a current at a voltage of at least 10 volts.

The thin-layer solar cells 1 are accordingly not divided up into individual pieces, as previously, but are left entirely as they are, and the resulting electrical current is transformed by electronic means into the desired form, such as to the desired voltage level or the correct frequency.

Since the thin-layer solar cells 1 are not connected in series, the electrical current which is taken from them, has a voltage of only 0.5 volt, for example. Its current intensity, on the other hand, is correspondingly high (about 120 A). The proposed solar cell system possesses a current collector system with the capacity to output such large currents. The current collector system is connected in an appropriate fashion to the solar cell layers.

A solar cell generator 6 consists of one or more thin-layer solar cells 1, which are connected to one or more voltage converters 2. In the case of solar cell generators 6 with several thin-layer solar cells 1, these are either connected in parallel, or inserted in pairs with a mid-point tapping. In the case of parallel connection of the thin-layer solar cells 1 (see FIG. 1), the resulting electrical current has a voltage of about 0.5 volt, and a voltage of about 1 volt in the case of a paired mid-point tapping (see FIG. 3).

Thin-layer solar cells 1 of any size may be used, because they can be produced by a continuous production process (e.g. manufacture in strip form).

The cells comprise several unperforated layers: the foremost layer comprises a contact layer to collect the resulting D.C. electrical current. In a preferred embodiment, it consists of a large number of transverse collectors 4 made of a conductive material, which are arranged parallel to the transverse sides of the thin-layer solar cell 1 and lead into strip-shaped longitudinal conductors 15.

Figure 1A:
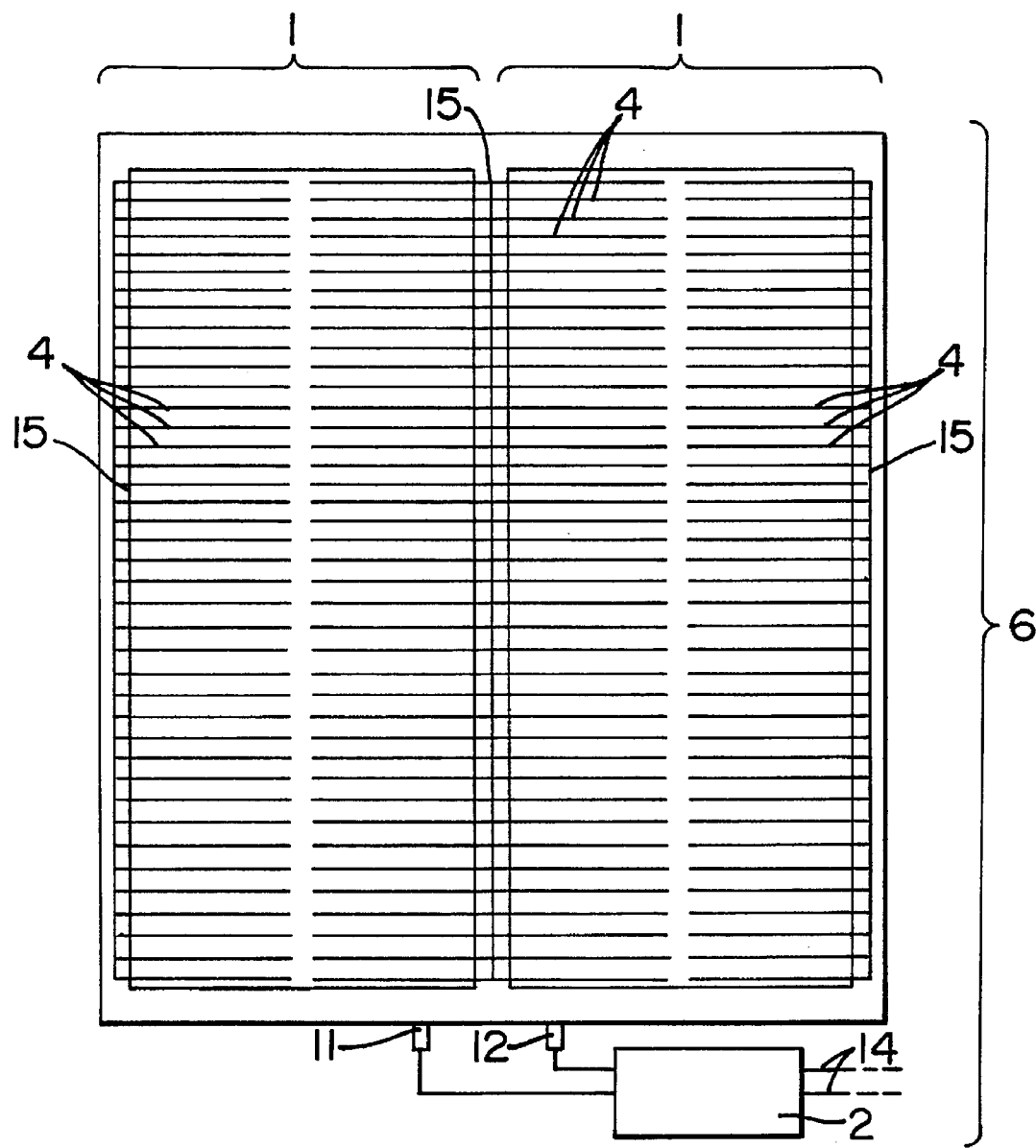
FIG. 1a is a plan view of a solar cell generator comprising two large-area, parallel-connected thin-layer solar cells combined with a voltage converter.
Figure 1B:
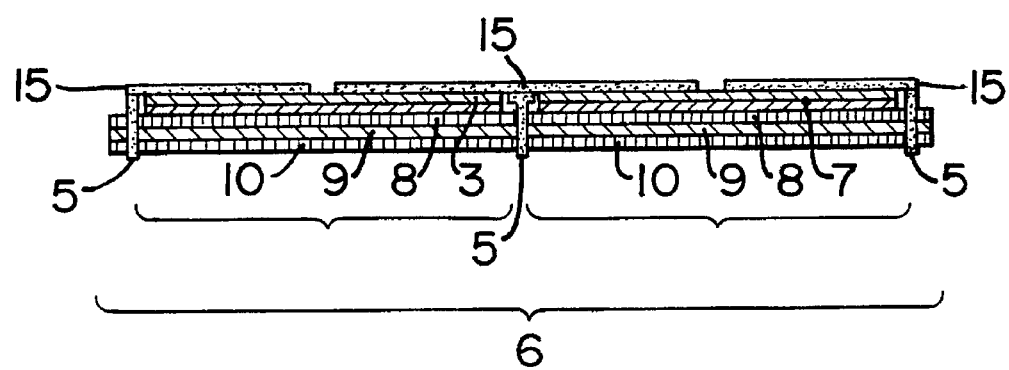
FIG. 1b is a cross-section through a solar cell generator comprising two large-area, parallel-connected thin-layer solar cells in the area of two transverse collectors.

A solar cell generator 6 with two thin-layer solar cells 1 connected in parallel is shown in FIG. 1. The longitudinal sides of the thin-layer solar cells 1 are contiguous with one another. A central longitudinal conductor 15 is arranged between both thin-layer solar cells 1, and a further external longitudinal conductor 15 runs along each outer longitudinal side of both thin-layer solar cells 1. A large number of transverse collectors 4, which run at right angles to the central longitudinal conductor 15, branch off from both sides of the central longitudinal conductor 15. Transverse collectors 4 branch off only toward the inside from both outer longitudinal conductors 15. The transverse collectors 4 are all of approximately the same length.

One transverse collector 4 for each of the outer longitudinal conductors 15 and two transverse collectors 4 for the central longitudinal conductor 15 lie in a linear relationship with one another.

In a preferred embodiment, their length is slightly shorter than half the width of the active p-i-n layer 7. The transverse collectors 4 of the central and outer longitudinal conductors 15 thus do not come into contact with one another at the center of the thin-layer solar cells 1.

An embodiment is also possible, however, in which the length of the transverse collectors 4 is so great that each transverse collector 4 of the outer longitudinal conductors 15 makes contact with that transverse collector 4 of the central longitudinal conductor 15 which lies in a linear relationship with, and faces towards it (not shown). This does not cause any problems, since all the transverse collectors 4 that lie in a linear relationship with one another are at the same potential.

The longitudinal conductors 15 are slightly shorter than the active p-i-n layer 7. They exhibit the same thickness as the transverse collectors 4. Several strip-shaped lead-throughs 5 project at right angles at regular intervals on their underside. The length of these lead-throughs 5 is slightly greater than the thickness of a thin-layer solar cell 1 (see FIG. 1b).

Figure 3A:
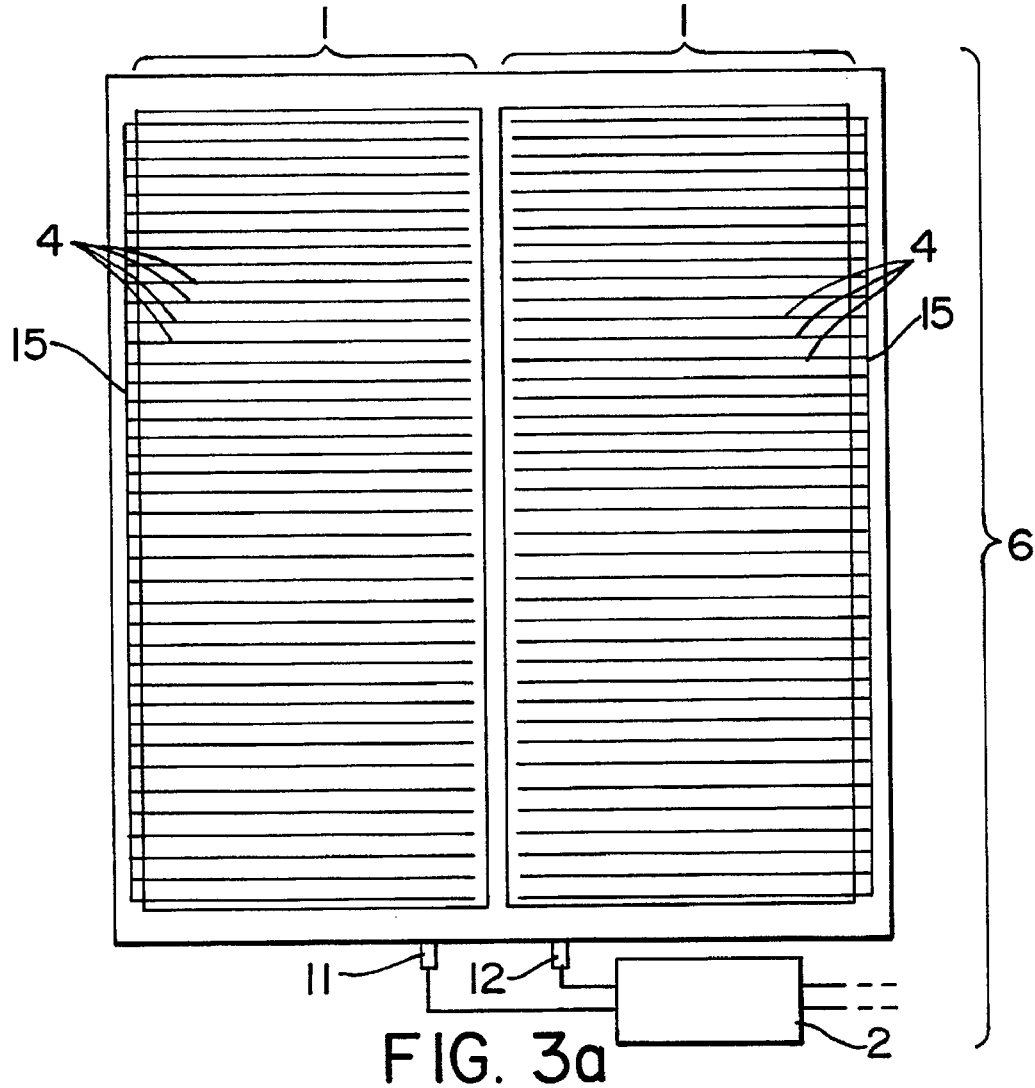
FIG. 3a is a plan view of a solar cell generator comprising two large-area, thin-layer solar cells, which are inserted in a mid-point tapping and are combined with an electronic voltage converter.

A solar cell generator 6 with two thin-layer solar cells 1 inserted in a mid-point tapping is illustrated in FIG. 3.

In this case, one strip-shaped longitudinal conductor 15 runs along the outer longitudinal side of each thin-layer solar cell 1. Transverse collectors 4 branch off from the inside of both longitudinal conductors 15, which transverse collectors also run at right angles to the longitudinal conductors 15 and have a length slightly shorter than the width of the active p-i-n layer 7. The transverse collectors 4 thus do not quite reach as far as the inner longitudinal sides of the active p-i-n layer 7. Both longitudinal conductors 15 preferably exhibit the same number of transverse collectors 4.

Figure 3B:
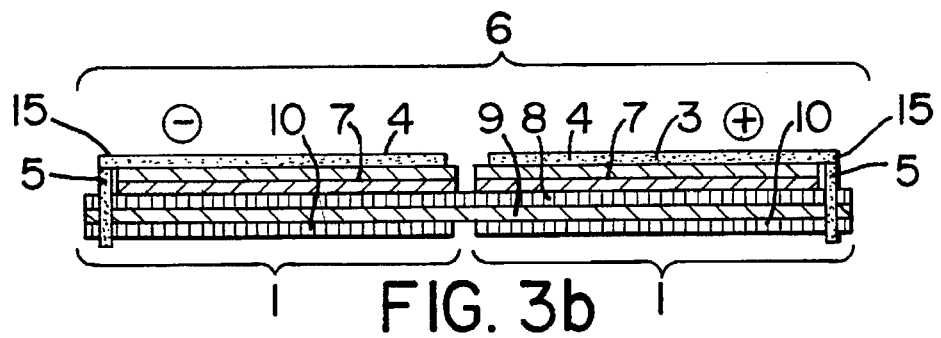
FIG. 3b is a cross-section through a solar cell generator comprising two large-area, thin-layer layer solar cells inserted in a mid-point tapping in the area of the foremost transverse collector.

In this case, too, the longitudinal conductors 15 are slightly shorter than the active p-i-n layer 7 and more or less of the same thickness as the transverse collectors 4 (see FIG. 3b).

Several strip-shaped lead-throughs 5 project at right angles at regular intervals on their underside. The length of these lead-throughs 5 is slightly greater than the thickness of a thin-layer solar cell 1 (see FIG. 1b).

The active p-i-n layer 7 (semiconductor layer) is arranged directly behind the front contact layer 3.

In the embodiment of a solar cell generator 6 with two thin-layer solar cells 1 connected in parallel, the p-i-n layers 7 of both thin-layer solar cells 1 are of identical construction. It is not necessary for the p-i-n layers 7 of both thin-layer solar cells 1 to be separated from one another. Apart from the variant with two separate p-i-n layers 7, a variant is also possible in which the p-i-n layers 7 of both thin-layer solar cells 1 are connected together, i.e. consist of a single plate.

In the embodiment of a solar cell generator 6 with pairs of thin-layer solar cells 1 inserted into a mid-point tapping, however, the construction of the p-i-n layer of one thin-layer solar cell 1 and the construction of the p-i-n layer of the other thin-layer solar cell 1 are inverted. This means that, in the case of the p-i-n layer 7 of one of the thin-layer solar cells 1, the negative pole lies at the front and the positive pole lies at the rear, and in the case of the other thin-layer solar cell 1 the opposite is true, i.e. the positive pole lies at the front and the negative pole lies at the rear.

An intermediate conductive layer 8 is present behind the active p-i-n layer 7.

In the embodiment of a solar cell generator 6 with two-layer solar cells 1 connected in parallel, the intermediate conductive layer 8 is continuous. It is only perforated at the center by the lead-throughs 5. Its width is slightly greater than the sum of the widths of the p-i-n layers 7, and its length is slightly greater than the length of the p-i-n layers 7.

In the embodiment of a solar cell generator 6 with two thin-layer solar cells 1 inserted into a mid-point tapping, the intermediate conductive layer 8 is also continuous (see FIG. 3b). In this case, however, it is not perforated at the center by lead-throughs 5. The overall width of the continuous, intermediate conductive layer 8 is slightly greater than the sum of the widths of both p-i-n layers 7, and its length is slightly greater than the length of the p-i-n layers 7.

The lead-throughs 5 penetrate these intermediate conductive layers 8 and are insulated from them. An insulating layer 9 is present behind the intermediate conductive layer 8. In both embodiments of a solar cell generator 6, this extends over the entire surface area of the intermediate conductive layer 8. The insulating layer 9 is also perforated by the lead-throughs 5 (see FIG. 3b).

A further conductive layer 10 is present, finally, at the very rear. In the embodiment of a solar cell generator 6 with thin-layer solar cells 1 connected in parallel, the rear conductive layers 10 of both solar cells 1 are continuous. The rear conductive layer 10 is in contact with the transverse collectors 4 via the lead-throughs 5 and the longitudinal conductors 15. The conductive layers 8 and 10 have a large cross-section and serve as heavy-current conductors, which carry the generated electrical current to the supply terminals 11, 12 of the thin-layer solar cells to which the voltage converter 2 is connected.

In the embodiment of a solar cell generator 6 with pairs of thin-layer solar cells 1 inserted into a mid-point tapping, the rear conductive layers 10 of both thin-layer solar cells 1 are not continuous. The rear conductive layer 10 of each thin-layer solar cell 1 is in contact with the transverse collectors 4 on the front side of the same thin-layer solar cell 1 via the lead-throughs 5. The conductive layers 8 and 10 have a large cross-section and serve as heavy-current conductors in this case, too. The intermediate conductive layer 8 thus connects the positive pole of one thin-layer solar cell 1 to the negative pole of the other thin-layer solar cells 1. Both rear conductive layers 10 conduct the current generated by both thin-layer solar cells 1 to both supply terminals 11, 12.

The electronic voltage converter 2, which transforms the voltage of the direct current generated by the thin-layer solar cells 1 to the appropriate level for the consumers, is connected to both supply terminals 11, 12. The voltage level is dependent on the demand in each case and lies in the range from 10–400 volts.

Voltage converters 2 of a familiar type are used, whose elements are produced in accordance with present-day technology and are thus capable of withstanding the load imposed by high current intensities. A DC/AC transformer can be used as a voltage converter 2 to produce an alternating current. The voltage transformer 2 is preferably mounted directly on the conductive layers, thus enabling voltage drops on the supply lines to be avoided.

The voltage converter 2 feeds the electrical current into the consumer network 14 at a higher voltage.

It is envisaged, furthermore, to combine not only thin-layer solar cells 1 with a single p-n junction, but also thin-layer solar cells with several p-n junctions, so-called multilayer cells, in the manner described above to produce a solar cell generator 6. This has the advantage that the cell voltage is higher. The cell voltage is 1 volt, for example, in the case of dual cells with two p-n junctions, and 1.5 volt in the case of a triple cell with three p-n junctions.

The proposed solar cell system exhibits major advantages over previously disclosed solar cell systems, in which a large number of solar cells of small surface area were connected together in series. The ability to use non-perforated thin-layer solar cells 1 with a large surface area in the proposed solar cell system dispenses with the need for costly and expensive laser cutting and the associated connection of the individual cells to one another. This results in considerable simplification of the production process. Less material is required to manufacture such large-area thin-layer solar cells 1, and less waste is produced compared with the previously used thin-layer solar cells 1 divided up into small areas.

The system efficiency of the solar cell generators 6 of the proposed solar cell system is higher because, on the one hand, the so-called solar cell miss-match is dispensed with and, on the other hand, the modules with their large surface area exhibit fewer inactive zones than the previously used modules made up of thin-layer solar cells with a small surface area.

Finally, the proposed solar cell system possesses the additional advantage that the electrical voltage in the thin-layer solar cells 1 is very low, as a consequence of which no problems occur with regard to the dielectric strength. The insulation of the conductors is accordingly far less costly than tin the previously used solar modules.

Thanks to the proposed solar cell system, the manufacturing costs of solar cell generators can be considerably reduced. One reason for the low manufacturing costs is the fact that, in the proposed solar cell system, the thin-layer solar cells 1 can be produced by a continuous production process, for example manufacture in strip form.

This will play a part in increasing the commercial interest in solar energy, including in the industrialized nations with their low amounts of sunshine.

I claim:

1. A solar cell system, comprising:
    at least one solar cell having a semiconductor layer having front and rear sides;
    first and second current collector means respectively provided on rear and front sides of the at least one solar cell;
    and means for connecting the first and second current collector means to an external element;
    wherein the first current collector means comprises a first substantially homogeneous conductive layer in contact with the rear side of said semiconductor layer, and the second currant collector means comprises a second substantially homogeneous conductive layer below said first conductive layer and separated therefrom by an insulating layer;
    said second current collector means further comprising a plurality of transverse collectors on the first surface of said semiconductor layer, the plurality of transverse collectors being connected to a longitudinal conductor extending along a longitudinal extent of the semiconductor body, and means electrically connecting said longitudinal conductor to said second conductive layer.

2. A solar cell system as claimed in claim 1, wherein the at least one solar cell comprises a thin-layer solar cell.

3. A solar cell system as claimed in claim 2, wherein the thin-layer solar cell has a continuous surface area.

4. solar cell system as claimed in claim 3, wherein the thin-layer solar cell comprises a strip section having the continuous surface area.

5. A solar cell system as claimed in claim 1, wherein the connecting means comprises a plurality of lead-throughs, the lead-throughs perforating the first conductive layer and being insulated therefrom, and the lead-throughs projecting through the insulating layer.

6. A solar system as claimed in claim 1, which further comprises a voltage converter for increasing the voltage of said system to between 10 and 400 v.

7. A solar cell system as claimed in claim 6, wherein the voltage converter is directly connected with the first and second conductive layers.

8. A solar system as claimed in claim 1, further comprising a DC/AC transformer for producing an alternating current.

9. A solar cell system as claimed in claim 1, wherein the semiconductor layer comprises several p-n junctions.

10. A solar cell system as claimed in claim 1, wherein the external element comprises a voltage converter.

11. A solar cell system, comprising:
    at least one pair of identical solar cells each having a semiconductor layer having front and rear surfaces, connected in parallel with each other and having longitudinal sides thereof, arranged in closely spaced adjacency; first and second current collector means respectively provided on rear and rear and front sides of each of the solar cells; and
    means for connecting the current collector means to an external element;
    wherein the first current collector means comprises a first sustantially homogenous conductive layer, and the second current collector means comprises a second substantially homogenous conductive layer below said first conductive layer and separated therefrom by an insulating layer;
    the second current collector means further comprising a common central longitudinal conductor arranged between adjacent longitudinal conductors arranged on respective remote sides of the solar cells;
    first transverse current collectors on said front sides of said semiconductor layers and extending from opposite sides of the common central longitudinal conductor, and second transverse current collectors extending from a respective remote side longitudinal conductor and spaced from the first transverse current collectors.

12. A solar cell system as claimed in claim 11, wherein the semiconductor layer of each solar cell has a positive pole arranged at one of the front or rear sides.

13. A solar cell system as claimed in claim 12, wherein both solar cells have a common second conductive layer.

14. A solar cell system as claimed in claimed in claim 11 wherein both solar cells have a common first conductive layer.

15. A solar cell system as claimed in claim 14, further including a voltage converter with two supply terminals, and wherein the first conductive layer is connected to one of the terminals, and the second conductive layer is connected to another of the terminals.

16. A solar cell system as claimed in claim 15, wherein the solar cells of the pair are connected with a perforated second conductive layer.

17. A solar cell system as claimed in claim 11, wherein the external element comprises a voltage converter.

* * * * *